United States Patent [19]

Bonham et al.

[11] 3,954,475

[45] May 4, 1976

[54] PHOTOSENSITIVE ELEMENTS CONTAINING CHROMOPHORE-SUBSTITUTED VINYL-HALOMETHYL-S-TRIAZINES

[75] Inventors: James A. Bonham, Pine Springs; Panayotis C. Petrellis, Oakdale, both of Minn.

[73] Assignee: Minnesota Mining and Manufacturing Company, St. Paul, Minn.

[22] Filed: Sept. 10, 1973

[21] Appl. No.: 395,419

Related U.S. Application Data

[62] Division of Ser. No. 177,851, Sept. 3, 1971.

[52] U.S. Cl. .................................. 96/67; 96/35.1; 96/86 P; 96/87 R; 96/88; 96/115 P; 96/47; 260/240 D; 260/240.6; 260/240.9; 260/248 CS
[51] Int. Cl.$^2$ .................... G03C 1/76; G03C 1/94; G03C 1/68; G03C 1/00
[58] Field of Search .......... 260/240.6, 240 D, 240.9, 260/248 CS; 96/115 P, 88, 35.1, 87 R, 47, 86 P, 67

[56] References Cited
UNITED STATES PATENTS

| | | | |
|---|---|---|---|
| 2,461,943 | 2/1949 | Thurston | 260/249.5 |
| 3,163,647 | 2/1964 | Schaefer et al. | 260/248 |
| 3,617,288 | 11/1971 | Hartman et al. | 96/115 P |

OTHER PUBLICATIONS

Grundmann, et al., Bes. Dent. Chem., Vol. 84, pp. 684–688 (1951).
Koran, *Light Sensitive Systems*, J. Wiley & Sons (1965), pp. 180–181.

*Primary Examiner*—Jack P. Brammer
*Attorney, Agent, or Firm*—Alexander, Sell, Steldt & DeLaHunt

[57] ABSTRACT

Chromophore-substituted vinyl-halomethyl-s-triazine compounds are provided capable of free-radical generation upon excitation with radiation having a wavelength of from about 330 to about 700 millimicrons.

7 Claims, No Drawings

PHOTOSENSITIVE ELEMENTS CONTAINING CHROMOPHORE-SUBSTITUTED VINYL-HALOMETHYL-S-TRIAZINES

This is a division of application Ser. No. 177,851, filed Sept. 3, 1971.

This invention relates to chromophore-substituted vinyl-halomethyl-s-triazine compounds and to radiation-sensitive compositions and elements utilizing these compounds.

Compounds capable of generating halogen-containing free radicals on exposure to light are known in the art. Thus, Beebe et al. in a series of patents, U.S. Pat. Nos. 1,587,270 through 1,587,274, describes image forming compositions comprising synthetic resins or resin forming materials and a halogen liberating compound, e.g., iodoform, which on exposure to light initiates insolubilization of the resin in exposed areas. Clement, U.S. Pat. No. 2,099,297, describes an image forming composition containing a halogen liberating compound, e.g., iodoform, which forms an intensely colored image on exposure to light. Wainer, U.S. Pat. Nos. 3,042,515 and 3,042,516 among others, describes the production of stable print-out images by exposing a composition comprising a resin binder, one or more aryl amines and one or more halogenated hydrocarbons such as carbon tetrabromide which release halogen-containing free radicals on exposure to light.

These free-radical generating compounds of the prior art have a rather limited spectral sensitivity, namely at wavelengths in the ultraviolet region which are lower than normally useful from conventional sources. Accordingly, they do not possess the ability to efficiently utilize the emitted radiation energy of the high ultraviolet and visible regions thereby reducing their free-radical generating ability or output.

As a result of this inefficient employment of radiation owing to narrow spectral sensitivity, compounds are combined with the free-radical generating compounds which serve in a sense to broaden their spectral response. In reality, the additional compound exhibits a broad spectral response, and upon absorption of radiation, in some unexplained manner, is believed to transmit the absorbed energy to the free-radical generating compound which then is capable of discharging its function, i.e., to generate free-radicals. See, for example, Oster, U.S. Pat. Nos. 2,850,445; 2,875,047; and 3,097,096, which disclose the use of photoreducible dyes and mild reducing agents along with halogenated hydrocarbon free radical sources in photopolymerizable compositions. Also, Sprague, U.S. Pat. Nos. 3,106,466 and 3,121,633 disclose the use of various optical sensitizing dyes along with halogenated hydrocarbon free radical sources in print-out image compositions. These image forming compositions are sensitive to visible light because of the presence of the two components, the halogenated free radical source and the dye, are not entirely satisfactory since they must be selected to be compatible, one with the other, and with the components of the composition. Furthermore, it is often difficult to obtain intimate mixing and proper weight balance between the two components.

It is an object of the invention to provide radiation free-radical generating compounds having a broad spectral response, preferably in the visible light range. Another object is to provide compounds that have a photolabile halogen-containing moiety and a chromophoric group within one molecule to eliminate the need for a combination of compounds. It is also an object to provide compounds which are highly efficient absorbers of radiation from conventional light sources, especially visible light sources, and to provide photopolymerizable and photocrosslinkable compositions and elements useful in printing, duplicating, copying and other imaging systems containing such compounds. Still other objects will become apparent from the following description of the invention.

The objects of the invention are achieved by providing s-triazine compounds substituted by at least one halomethyl group, preferably a trihalomethyl group, and by a chromophoric moiety conjugated with the triazine ring by ethylenic unsaturation, said compound being capable on stimulation by actinic radiation at a wavelength of about 330 to about 700 millimicrons of generating free radicals.

Preferred chromophore-substituted vinyl-halomethyl-s-triazine compounds may be represented by the formula

FORMULA I

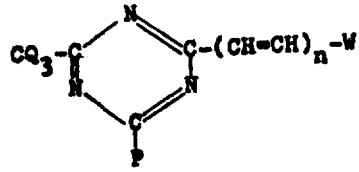

wherein Q is bromine or chlorine, P is —CQ$_3$, —NH$_2$, —NHR, —NR$_2$, or —OR where R is phenyl or lower alkyl (lower alkyl herein meaning an alkyl group having no more than 6 carbon atoms); n is an integer from 1 to 3; and W is an optionally substituted aromatic or heterocyclic nucleus or

FORMULA II

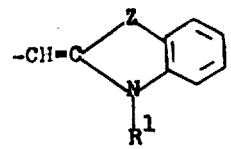

where Z is oxygen or sulfur and R$^1$ is hydrogen, a lower alkyl or phenyl group. Of course, where W is an aromatic or heterocyclic nucleus, the ring may be optionally substituted. Without attempting an exhaustive listing of substituents, the following are noted as typical: chloro, bromo, phenyl, lower alkyl (an alkyl having no more than 6 carbon atoms), nitro, phenoxy, alkoxy, acetoxy, acetyl, amino, and alkyl amino.

The s-triazine compounds as described above generate free radicals when irradiated with actinic radiation of a wavelength from about 330 to about 700 millimicrons. For this reason, the compounds are useful as photoinitiators in light sensitive compositions and elements. Thus, they may be incorporated into polymerizable, crosslinkable, and print-out compositions of use for preparing relief printing plates, photoresists, and photographic elements.

The compounds of the invention are the condensation reaction products of certain methyl-halomethyl-s-triazines and certain aldehydes or aldehyde derivatives.

The methyl-halomethyl-s-triazines employed in preparation of the compounds of the invention have the structure:

FORMULA III

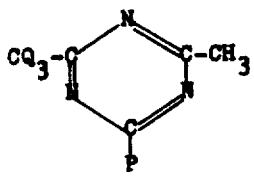

where Q and P have the same meaning as defined for Formula I. Suitable methyl-halomethyl-s-triazines include among others:

2,4-Bis-(trichloromethyl)-6-methyl-s-triazine
2,4-Bis-(tribromomethyl)-6-methyl-s-triazine
2,4-Bis-(dichloromethyl)-6-methyl-s-triazine
2-Trichloromethyl-4-methoxy-6-methyl-s-triazine
2-Trichloromethyl-4-phenoxy-6-methyl-s-triazine
2-Trichloromethyl-4-diethylamino-6-methyl-s-triazine
2-Tribomethyl-4-methylamino-6-methyl-s-triazine
2-Tribromomethyl-4-amino-6-methyl-s-triazine The preferred methyl halomethyl-s-triazine for use in preparing the compounds of the invention is 2,4-bis-(trichloromethyl)-6-methyl-s-triazine which yields chromophore-containing vinyl-bis-(trichloromethyl)-s-triazines which are the most preferred chromophore-containing vinyl-halomethyl-s-triazines of the invention.

Generally, the methyl-halomethyl-s-triazines may be prepared by the co-trimerization of organic nitriles and haloacetonitriles in accordance with the teachings of Wakabayashi et al., Bulletin of the Chemical Society of Japan, 42, 2924–30 (1969).

Suitable aromatic and heterocyclic aldehydes reactive with the methyl-halomethyl-s-triazines for synthesis of the compounds of the invention have the formula

FORMULA IV

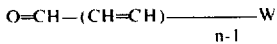

wherein $n$ and W have the same meaning as defined for Formula I. Suitable aldehydes include: aromatic aldehydes, e.g., benzaldehyde, 4-chlorobenzaldehyde, 3-nitrobenzaldehyde, benzaldehyde-4-sulfonic acid, benzaldehyde-4-dimethylsulfonamide, benzaldehyde-2-carboxylic acid, benzaldehyde-2-carboxylic acid methyl ester, cinnamaldehyde, anisaldehyde, 3,4-diphenoxybenzaldehyde, 4[2'-nitrophenyl]-benzaldehyde, 4-phenylazobenzaldehyde; aromatic polyaldehydes, e.g., terephthaldehyde; heterocyclic aldehydes, e.g., 3-pyrrolaldehyde, 2-phenyl-4-oxazolecarboxaldehyde, 3-benzopyrrolaldehyde, benzoxazole-2-carboxaldehyde, benzthiazole-2-carboxaldehyde, benzoxazolylideneacetaldehyde; and heterocyclic polymethine aldehydes that are used to synthesize cyanine dyes as disclosed by Hamer, "Cyanine Dyes and Related Compounds", Interscience Publishers, 1964.

Many of the aldehydes of Formula IV suitable for use in the preparation of the compounds of the invention are available commercially. Other suitable aldehydes may be prepared by the method taught for the preparation of imidazole-2-carboxaldehydes by Pyman, J. Chem. Soc., 101, 542 (1912) and the method for the preparation of heterocyclic aldehydes from the corresponding oximes by Forman in U.S. Pat. No. 3,150,125.

Suitable aldehyde derivatives reactive with the methyl-halomethyl-s-triazines for synthesis of the compounds of the invention have the formula

FORMULA V

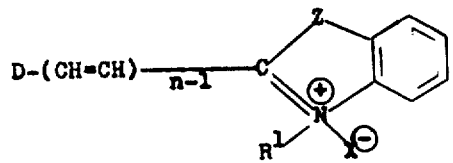

wherein $R^1$, Z and $n$ have the same meaning as defined for Formula II; D is a group reactive with reactive methylene groups including such groups as arylamino, e.g., $-NH(C_6H_5)$; acetarylamino, e.g., $-N(C_6H_5)-COCH_3$; alkoxy, e.g., $-OC_2H_5$; and alkylthio, e.g., $-SCH_3$; and X is an anion, as for example, chloride, bromide, iodide, sulfate, toluenesulfonate, ethoxyethyl sulfate. These aldehyde derivatives are quaternary salts having $-NH(C_6H_5)$, $-N(C_6H_5)COCH_3$, $-OC_2H_5$, and $-SC_2H_5$ groups attached through one or more vinylene segments to a heterocyclic compound having a quaternized nitrogen. Such compounds are used extensively in the photographic industry as intermediates for the production of sensitizing dyes. Examples of such intermediates useful for the production of the vinyl-halomethyl-s-triazine compounds of the invention include 2-(2'-acetanilidovinyl)benzoxazole ethiodide, 2-(2'-acetanilidovinyl)benzthiazole ethiodide, 2-(4'-acetanilidobutadienyl) benzoxazole ethiodide, and intermediates such as

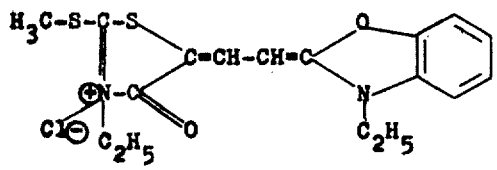

Suitable aldehyde derivatives having Formula V are compounds commonly used in the photographic industry for the synthesis of optical photosensitizers. These compounds are well described in the art, a summary of which appears in Hamer, "Cyanine Dyes and Related Compounds", page 116–147, Interscience Publishers, 1964.

One method by which photoinitiator compounds of the invention are prepared is by the condensation of the methyl-halomethyl-s-triazines with the aldehydes under conditions typical of the well-known Knoenenagel reaction for the condensation of aldehydes with reactive methylene compounds. The preparation of 2,4-bis(trichloromethyl)-6-styryl-s-triazine in refluxing toluene containing piperidinium acetate as a catalyst is an example of this method of preparation. The reaction may be carried out in the presence of other solvents including pyridine, benzene, ethylacetate, methanol, ethanol, t-butanol, xylene, acetic acid, acetic anhydride, tetrahydrofuran, and mixtures of solvents. Also, since water is formed during the reaction, it is advantageous to provide for its removal, as for example, by co-distilling with solvent or reaction with the solvent. The time of heating and the temperature of heating required for the condensation reaction is dependent on the particular compounds being condensed and the catalyst chosen for the reaction. Generally, temperatures of from about 25° to 150° C. for from 1 hour to about 24 hours is sufficient to provide for the reaction. Preferably the reaction is carried out at temperatures from about 50° to 130° C. for from about 3 to 12 hours. The condensation reaction may also be performed in the absence of solvents simply by heating the two reactants together with a catalyst at temperatures of from 100° to about 140° C.

Because of the reactive nature of the halomethyl group toward nucleophiles, the preferred catalysts for the condensation of methyl-halomethyl-s-triazines with aldehydes and aldehyde derivatives are salts such as, for example, piperidinium acetate.

In another method of synthesis of the photoinitiators of the invention, methyl-halomethyl-s-triazines are condensed with various β-anilino-, β-acetoxy-anilino- and β-alkythio-intermediates that are useful in the preparation of cyanine dyes. Conditions for carrying out these condensations are the same as those used for condensing the methyl-halomethyl-s-triazines with aldehydes as described above.

Particularly valuable are the photoinitiators of the invention having the structure shown in Table 1.

TABLE 1

| Photoinitiator | Melting Point °C. | Absorption Maximum $CH_3OH$ $\lambda max$ | Extinction Coefficient $\epsilon \times 10$ |
|---|---|---|---|
| 1. $Cl_3C$—triazine—CH=CH—phenyl | 156–158 | 335 | 2.97 |
| 2. $Cl_3C$—triazine—(CH=CH)$_2$—phenyl | 147–149 | 378 | 3.68 |
| 3. $Cl_3C$—triazine—CH=CH—phenyl—Cl | 199–201 | 343 | 3.03 |
| 4. $Cl_3C$—triazine—CH=CH—phenyl—$OCH_3$ | 190–192 | 377 | 2.75 |
| 5. $Cl_3C$—triazine—CH=CH—phenyl—($OCH_3$)$_2$ | 186–187 | 394 | 2.98 |
| 6. $Cl_3C$—triazine—CH=CH—phenyl—($OCH_3$)$_2$ | 157–158 | 401 | 2.98 |
| 7. $Cl_3C$—triazine—CH=CH—phenyl—$N(CH_3)_2$ | >230d. | 468 | 1.59 |

TABLE 1-continued

| Photoinitiator | Melting Point °C. | Absorption Maximum CH₃OH λmax | Extinction Coefficient ε × 10 |
|---|---|---|---|
| 8. Cl₃C-[triazine]-(CH=CH)₂-C₆H₄-N(CH₃)₂ with CCl₃ | ~220ᵃ | 491 | 1.98 |
| 9. Cl₃C-[triazine]-(CH=CH)₃-C₆H₄-N(CH₃)₂ with CCl₃ | 180–182ᵃ | 495 | 0.71 |
| 10. Cl₃C-[triazine]-CH=CH-C₆H₄-O-C₅H₁₁ with CCl₃ | 128–129 | 380 | 3.54 |
| 11. Cl₃C-[triazine]-CH=CH-CH=[benzoxazoline, N-C₂H₅] with CCl₃ | 155–157 | 488 | 4.00 |
| 12. Cl₃C-[triazine]-CH=CH-[indoline with N-CH₃, 2-(4-OCH₃-phenyl)] with CCl₃ | 175d. | 447 | 2.12 |
| 13. H₂N-[triazine]-CH=CH-C₆H₄-OCH₃ with CCl₃ | 248–249 | 340 | 3.32 |

ᵃdetermined by the Kofler Heizbank method.

The photoinitiators of the invention are particularly useful in photosensitive compositions employed in various image forming systems where increased sensitivity to light is desirable. Thus, photopolymerizable compositions containing the photoinitiators of the invention are valuable for the preparation of elements used in the field of office copying and particularly for the preparation of elements useful for reflex copying as disclosed in assignee's patent application Smith, Ser. No. 133,189, filed Apr. 12, 1971 and now abandoned. They are also valuable for elements useful for the preparation of photopolymer lithographic plates. The photoinitiators may also be present in non-silver photosensitive compositions useful in photoreproduction systems based on the release of acid such as the systems disclosed in U.S. Pat. Nos. 3,512,975 and 3,525,616 and in systems wherein colored printout or bleach images are formed.

The photopolymerizable compositions wherein the photoinitiators of the invention may be used advantageously are usually composed of an ethyleneically unsaturated, free-radical initiated, chain-propagating addition polymerizable compound; a photoinitiator; and optionally one or more fillers, binders, dyes, polymerization inhibitors, color precursors, oxygen scavengers, etc. The s-triazine compounds of this invention are present in an amount sufficient to effect polymerization of said polymerizable compound. Suitable ratios of ingredients include the following: for every 100 parts of polymerizable compound there may be present from 0.005 to 10 parts of photoinitiator, from 0 to 200 parts of filler, from 0 to 200 parts of binder and from 0 to 10 or more parts of dyes, polymerization inhibitors, color recursors, oxygen scavengers, etc. as may be needed for a particular use of the photopolymerizable composition. Preferably there is used per 100 parts of polymerizable compounds 1 to 7.5 parts of photoinitiator and from 25 to 150 parts of binder.

Suitable ethyleneically unsaturated, free-radical initiated, chain-propagating addition polymerizable compounds include alkylene or polyalkylene glycol diacrylates, e.g., ethylene glycol diacrylate, diethylene glycol diacrylate, glycerol diacrylate, glycerol triacrylate, ethylene glycol dimethyacrylate, 1,3-propanediol dimethacrylate, 1,3-propanediol dimethacrylate, 1,2,4-butanetriol trimethacrylate, 1,4-cyclohexanediol diacrylate, pentaerythritol tetramethacrylate, pentaerythritol triacrylate, sorbitol hexacrylate; bis[1-(3-acryloxy-2-hydroxy)]-p-propoxyphenyl dimethylmethane, bis-[1-(2-acryloxy)]-p-ethoxyphenyl-dimethylmethane, trishydroxethylisocyanurate trimethacrylate, the bis-acrylates and bis-methacrylates of polyethylene glycols of molecular weight 200–500 and the like; unsaturated amides, e.g., methylene bis-acrylamide, methylene bis-methacrylamide, 1,6-hexamethylene bis-acrylamide, diethylene triamine trisacrylamide, β-methacrylaminoethyl methacrylate; vinyl esters such as divinyl succinate, divinyl adipate, divinyl phthalate, the preferred ethyleneically unsaturated compounds include pentaerythritol tetraacrylate, bis[p-(3-acryloxy-2-hydroxypropoxy)phenyl]dimethylmethane, and bis[p-(2-acryloxyethoxy)phenyl]dimethylmethane. Mixtures of these esters may also be used as well as mixtures of these esters with alkyl esters of acrylic acid and methacrylic acid including such esters as methyl acrylate, methyl methacrylate, ethyl acrylate, isopropyl methacrylate, n-hexyl acrylate, stearyl acrylate, allylacrylate, styrene, diallyl phthalate and the like.

In making the photosensitive compositions, the components are admixed in any order and stirred or milled to form a solution or uniform dispersion. Photosensitive elements are made by coating at a dry thickness of about 0.00005 to about 0.075 inch a suitable photosensitive composition on a suitable base or support and drying the coating.

Suitable bases or supports for the photosensitive compositions include metals, e.g., steel and aluminum plates, sheets and foils, and films or plate composed of various film-forming synthetic or high polymers including addition polymers, e.g., vinylidene chloride, vinyl chloride, vinyl acetate, styrene, isobutylene polymers and copolymers; linear condensation polymers e.g., polyethylene terephthalate, polyhexamethylene adipate, polyhexamethylene adipamide/adipate.

An element for reflex copying, for example, is made by coating under safelight conditions, a polyester film with a phhotosensitive composition prepared by thoroughly mixing 100 parts of trimethylol propane trimethacrylate, 166 parts of polyvinylbutyral and 6.6 parts of a photoinitiator of the invention such as 2,4-bis(trichloromethyl)-6-p-methoxy styryl-s-triazine in 3300 parts of a solvent such as ethylene dichloride. The coating is dried, laminated on the tacky surface with another polyester film and cut into appropriate sized elements. The elements obtained are used to copy originals that may be black and white or variously colored by placing the element on the original and exposing to radiation through the element. After exposure, the laminated polyester film is removed and the exposed element developed to reveal a negative copy of the original by dusting with a toner powder, which adheres to the tacky unexposed areas but not the photopolymerized exposed area.

The invention will be more specifically illustrated by the following examples.

EXAMPLE 1

Preparation of the photosensitizer 2,4-bis(trichloromethyl)-6-p-methoxystyryl-s-triazine.

To a mixture of 330 parts 2,4-bis(trichloromethyl)-6-methyl-s-triazine and 149.6 parts of p-anisaldehyde in 1 liter of toluene is added 45 parts piperidinium acetate as the condensation catalyst. The mixture is heated to reflux and the liberated water collected in a Dean-Starke extractor. After the collection of the theoretical amount of water, most of the toluene is removed by distillation and the resulting mixture cooled. The precipitated solid is filtered and washed several times with petroleum ether and three times with cold ethanol. A 77% yield is recorded. An analytical sample, mp. 190°–192° C., is obtained by recrystallizing the product from a mixture of ethanol-ethyl acetate.

The reaction can be run in the absence of solvent by thermally melting the triazine and the aldehyde in the presence of piperidinium acetate. The molten mixture is heated at 140° C. (oil bath temperature) for 60 minutes. Recrystallization afforded pure product, m.p. 190°–192° C. (compound 4 of Table 1).

EXAMPLE 2

Preparation of 2,4-bis(trichloromethyl)-6-(1-p-dimethylaminophenyl-1,3-butadienyl)-s-triazine.

A mixture containing 16.6 parts of 2,4-bis(trichloromethyl)-6-methyl-s-triazine, 9.6 parts of p-dimethylaminocinnamaldehyde, and 3.6 parts of piperidinium acetate in 65 parts of toluene is refluxed (approx. 1 hr.) until the theoretical amount of water is collected in a Dean Stark trap. Upon cooling, shiny black needles separated which are then collected by filtration. These crystals are slurried in hot ethanol and 14 parts product (Compound 7 of Table 1) isolated in the form of bluish-black shiny needles, m.p. 218°–220° C. (Kofler Heizbank).

EXAMPLE 3

Preparation of a merocyanine type dye, 2,4-bis(trichloromethyl)-6(N-ethyl-2(3H)-benzoxazolylidene)-ethylidene-s-triazine.

A mixture of 9.78 parts 2(N'-acetoxyanilinovinylidene)-N-ethylbenzoxazolium-p-toluene-sulfonate, 9.90 parts 2,4-bis(trichloromethyl-6-methyl-s-triazine and 50 parts of pyridine are heated at reflux for 0.5 hour. Methanol, 16 parts, is added and reflux continued for another 15 minutes. The reaction mass is then poured into 200 parts of water containing 20 parts of 30% ammonium hydroxide and extracted with benzene. The extracts are washed with dilute HCl, dried over anhydrous $MgSO_4$, and concentrated to give a red glassy material which solidifies upon addition of hexane. Crude products (Compound 11 in Table 1), 3.6 parts, m.p. 125°–130° is collected. Column chromatography using neutral alumina and benzene solvent gives approximately 2.0 parts of the desired product, m.p. 155°–157° C., which contains a minor impurity as evidenced by nmr analysis.

EXAMPLE 4

The preparation of 2-trichloromethyl-4-amino-6-p-methoxystyryl-s-triazine.

To a solution containing 5 parts of 2,4-bis(trichloromethyl)-6-p-methoxystyryl-s-triazine in 57 parts of dioxane is added 9 parts of 30% ammonium hydroxide. After 5 minutes at room temperature a precipitate begins to form. After 1 hour, this solid is collected by filtration, washed with 2:1 dioxane methanol, annd dried to give 3.8 parts of product (Compound 13 Table 1) as a light yellow solid, m.p. 248°–249° C.

EXAMPLE 5

Illustrating the preparation of photosensitive elements using the chromophore-containing vinyl-s-triazines of the invention and the spectral response of some of the compounds in such elements.

A solution containing 5.0 parts of Butvar B-72A (tradename for a polyvinyl butyral resin available from Monsanto Chemical Co.), 3.0 parts of trimethylol propane trimethacrylate, and 0.2 parts of 2,4-bis(trichloromethyl)-6-p-methoxy styryl-s-triazine in 100 parts of ethylene dichloride is knife coated 2 mils wet on polyester film. After the solvent has evaporated, the tacky coating is laminated to another polyester film and the sandwich construction then exposed for 10 seconds to a tungsten-iodide lamp through a photographic step-wedge. The films are peeled apart and the coating dusted using a 3M Brand System A-09 (tradename) fusable toner powder, which adheres to the tacky unexposed areas, but not to the photopolymerized regions. A permanent, non-smearable positive image is produced corresponding to 4 open steps on the wedge.

Similar constructions are prepared using the same amounts (0.2 part) of the photoinitiators listed in Table 2 and their action spectra individually measured using a laboratory constructed wedge spectrograph. The observed responses listed correlate within experimental error with the absorption maxima and spectrum of these materials.

TABLE 2

| PHOTOINITIATOR | ABSORPTION MAXIMUM | APPROX. SPECTRAL RESPONSE |
|---|---|---|
| Compound 4 of Table 1 | 377 m$\mu$ | 380–440 m$\mu$ |
| Compound 5 of Table 1 | 394 m$\mu$ | 390–450 m$\mu$ |
| Compound 8 of Table 1 | 491 m$\mu$ | 480–560 m$\mu$ |

EXAMPLE 6

Preparation of printing plates illustrating the superior efficiency in the presence of oxygen of the chromophore-containing photoinitiators of the invention to conventional free radical initiators.

A series of pour coatings are made on anodized aluminum plates (commercially available as Western Granite Grain, tradename, from Western Litho Plate and Supply Company) utilizing homogeneous solutions in ethylene dichloride:

| | |
|---|---|
| Formvar 15/95S (tradename for a polyvinyl formal resin available from the Monsanto Chemical Co.) | 7.38 |
| VMCH vinyl resin (tradename for a vinyl acetate/vinyl chloride/maleic anhydride copolymer available from Union Carbide Co.) | 2.46 |
| Trimethylol propane trimethacrylate | 6.00 |
| Trismethacrylate of trishydroxethyl isocyanurate | 2.00 |
| Cyan XR-553758 (tradename for a phthalocyanine pigment available from American Cyanamid) | 1.22 |
| Initiator (see Table 3) | 0.40 |

Coating weights are approximately 200 mg/ft$^2$ after drying at 140° F. for 2 minutes.

The plates are all exposed for 70 seconds through a step-wedge in a vacuum frame using a reflectorized 135 amp. High Intensity Photo 118 Carbon Arc Rod (tradename, Union Carbide) source at a distance of 54 inches. To develop, they are covered with a solution containing 35% n-propyl alcohol, 60% distilled water, 1.5% ammonium sulfite, and 1.5% ammonium dihydrogen phosphate. The non-exposed areas are removed using a 3M Brand (tradename) Developing Pad with a uniform light-to-moderate scrubbing action. Table 3 indicates the relative efficiency of the various photoinitiators used by the number of steps that developed. It is seen that 11 steps developed on plates prepared using the chromophore-containing photoinitiators of the invention while no more than 7 steps developed on plates using photoinitiators disclosed in prior art.

TABLE 3

| | PHOTOINITIATOR | STEPS DEVELOPED |
|---|---|---|
| 1. | 0.4 parts benzoin methylether | 0–1 |
| 2. | 0.4 parts anthraquinone | 0–1 |
| 3. | 0.4 parts phenanthraquinone | 0–1 |
| 3. | 0.4 parts 2-ethyl-9, 10-dimethoxyanthracene 0.4 parts iodoform | 0–1 |
| 5. | 0.4 parts iodoform | 0–1 |
| 6. | 0.4 parts ethyl-9, 10-dimethoxyanthracene 0.4 parts 2,4,6-tris(tribromomethyl)-s-triazine | 7 |
| 7. | 0.4 parts 2-ethyl-9-10-dimethoxyanthracene 0.4 parts 2,4-bis(trichloromethyl)-6-methyl-s-triazine | 3 |
| 8. | 0.4 parts 1-(p-methoxyphenyl)-3-(p-diphenyl- | 4 |

TABLE 3-continued

| | PHOTOINITIATOR | STEPS DEVELOPED |
|---|---|---|
| | amine-phenyl)-2-propene-1-one 0.4 parts 2,4-bis(trichloromethyl)-6-methyl-s-triazine | |
| 9. | 0.4 parts chromophore-containing photoinitiator (compound 4 of Table 1) | 11 |
| 10. | 0.4 parts chromophore-containing photoinitiator (compound 5 of Table 1) | 11 |

EXAMPLE 7

Illustrating the utility of the chromophore-containing photoinitiators in photoreproduction systems based on the release of acid.

A photosensitive composition containing:

| | |
|---|---|
| Butvar B-72A (tradename) | 2.5 parts |
| p-dimethylaminophenyl-bis-(2-methylindolyl)methane | 1.0 parts |
| compound 4 of Table 1 | 0.5 parts |
| methanol/ethylene dichloride | 3.0 parts | is coated 3 mil wet on polyester film. Upon exposure, a deep magenta color forms that is characteristic of the oxidized form of the leuco dye.

In a similar manner, the leuco base, 2-p-dimethyl styryl quinoline, and leuco dye, leuco crystal violet, also gave print-out images based on photolytic acid production and photooxidation processes when substituted for p-dimethyl-aminophenyl-bis-(2methylindolyl)methane.

We claim:

1. A composition comprising:
   1. an ethylenically unsaturated, freeradical initiated, chain propagating addition polymerizable compound and
   2. a compound having the formula:

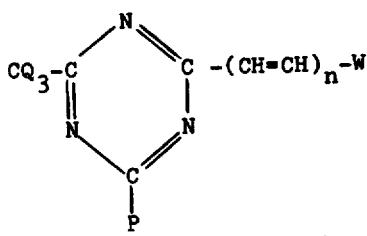

wherein Q is bromine or chlorine, P is $-CQ_3$, $-NH_2$, $-NHR$, $-NR_2$ or $-OR$ where R is phenyl or lower alkyl, $n$ is an integer from 1 to 3 and W is an optionally substituted phenyl, pyrryl, benzopyrryl, oxazoyl, benzoxazoyl, benzthiazoyl or

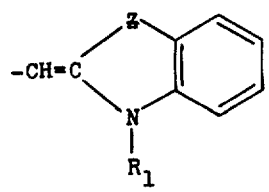

where $Z$ is oxygen or sulfur and $R_1$ is hydrogen, a lower alkyl or a phenyl group, said compound being capable of generating free radicals on stimulation by actinic radiation at a wavelength of about 330 to about 700 millimicrons.

2. The composition of claim 1 wherein Q is $-Cl$ and P is $-CCL_3$.

3. A photosensitive sheet construction comprising a substrate having a light-sensitive coating thereon, said coating comprising a compound having the formula:

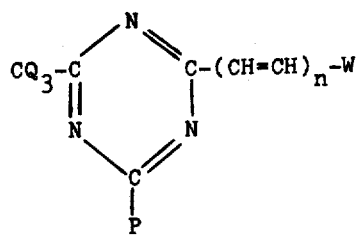

wherein Q is bromine or chlorine, P is $-CQ_3$, $-NH_2$, $-NHR$, $-NR_2$ or $-OR$ where R is phenyl or lower alkyl, $n$ is an integer from 1 to 3 and W is an optionally substituted phenyl, pyrryl, benzopyrryl, oxazoyl, benzoxazoyl, benzthiazoyl, or

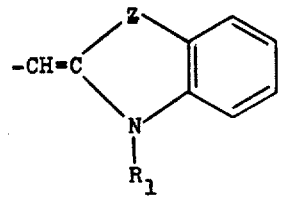

wherein $Z$ is oxygen or sulfur and $R_1$ is hydrogen, a lower alkyl or a phenyl group, said compound being capable of generating free radicals on stimulation by actinic radiation at a wavelength of about 330 to about 700 millimicrons.

4. The photosensitive sheet construction of claim 3 wherein said coating further comprises an ethylenically unsaturated, free-radical initiated, chain propagating addition polymerizable compound.

5. A composition comprising:
   1. an ethylenically unsaturated, free-radical initiated, chain propagating addition polymerizable compound, and
   2. a compound having the formula:

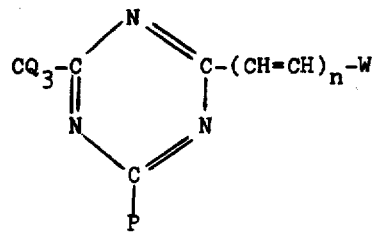

wherein Q is bromine or chlorine, P is —CQ$_3$, —NH$_2$, —NHR, —NR$_2$ or —OR where R is phenyl or lower alkyl, n is an integer from 1 to 3, and W is an optionally substituted aromatic or heterocyclic nucleus or

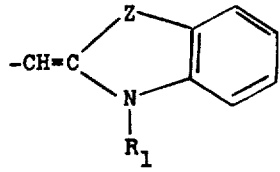

where Z is oxygen or sulfur and R$_1$ is hydrogen, a lower alkyl or a phenyl group, said compound being capable of generating free radicals on stimulation by actinic radiation at a wavelength of about 330 to about 700 millimicrons.

6. A photosensitive sheet comprising a substrate having a light-sensitive coating thereon, said coating comprising a compound having the formula:

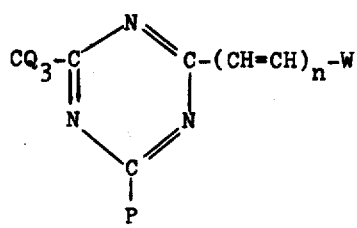

wherein Q is bromine or chlorine, P is —CQ$_3$, —NH$_2$, —NHR, —NR$_2$ or —OR where R is phenyl or lower alkyl, n is an integer from 1 to 3, and W is an optionally substituted aromatic or heterocyclic nucleus or where Z is oxygen or sulfur and R$_1$ is hydrogen, a lower alkyl or a phenyl group, said compound being capable of generating free radicals on stimulation by actinic radiation at a wavelength of about 330 to about 700 millimicrons.

7. The photosensitive sheet of claim 6 wherein said coating further comprises an ethylenically unsaturated, free radical initiated, chain propagating addition polymerizable compound.

* * * * *